(12) United States Patent
Lin et al.

(10) Patent No.: US 12,593,731 B2
(45) Date of Patent: Mar. 31, 2026

(54) PACKAGING STRUCTURE AND MANUFACTURING METHOD THEREOF

(71) Applicant: JCET GROUP CO., LTD., Wuxi City (CN)

(72) Inventors: Yaojian Lin, Wuxi City (CN); Chen Xu, Wuxi City (CN); Shuo Liu, Wuxi City (CN); Danfeng Yang, Wuxi City (CN); Shasha Zhou, Wuxi City (CN); Xueqing Chen, Wuxi City (CN); Chenye He, Wuxi City (CN)

(73) Assignee: JCET GROUP CO., LTD., Wuxi City (CN)

( * ) Notice: Subject to any disclaimer, the term of this patent is extended or adjusted under 35 U.S.C. 154(b) by 639 days.

(21) Appl. No.: 18/077,186

(22) Filed: Dec. 7, 2022

(65) Prior Publication Data

US 2023/0187422 A1 Jun. 15, 2023

(30) Foreign Application Priority Data

Dec. 9, 2021 (CN) .......................... 202111496220.4

(51) Int. Cl.
*H01L 25/10* (2006.01)
*H01L 21/48* (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS

| | | | | |
|---|---|---|---|---|
| 2009/0146760 | A1* | 6/2009 | Reefman ............. | H01L 23/5223 |
| | | | | 333/184 |
| 2020/0312766 | A1* | 10/2020 | Bhagavat ........... | H01F 17/0033 |
| 2021/0057343 | A1* | 2/2021 | Chang ................. | H01L 21/4857 |

FOREIGN PATENT DOCUMENTS

| | | | |
|---|---|---|---|
| CN | 102299143 A | 12/2011 | |
| CN | 112038330 A * | 12/2020 | ............. H01L 25/50 |

(Continued)

*Primary Examiner* — Wael M Fahmy
*Assistant Examiner* — Quinton A Brasfield
(74) *Attorney, Agent, or Firm* — MUNCY, GEISSLER, OLDS & LOWE, P.C.

(57) ABSTRACT

The present invention provides a packaging structure and a manufacturing method thereof. The packaging structure includes: a lower package, an upper package disposed above the lower package, and a first redistribution stack layer that is disposed between the lower package and the upper package and is electrically connected to the lower package and the upper package. The lower package includes a first prefabricated redistribution stack layer and a first plastic packaging layer surrounding the first prefabricated redistribution stack layer. A minimum line width and line spacing of at least one first prefabricated conductive layer in the first prefabricated redistribution stack layer is less than a minimum line width and line spacing of at least one first conductive layer in the first redistribution stack layer.

15 Claims, 9 Drawing Sheets

100

(51) Int. Cl.

| | |
|---|---|
| *H01L 23/00* | (2006.01) |
| *H01L 23/31* | (2006.01) |
| *H01L 23/538* | (2006.01) |
| *H01L 25/00* | (2006.01) |
| *H10D 1/20* | (2025.01) |
| *H10D 1/68* | (2025.01) |

(52) U.S. Cl.

CPC ...... *H01L 23/3121* (2013.01); *H01L 23/5383* (2013.01); *H01L 23/5385* (2013.01); *H01L 25/50* (2013.01); *H10D 1/20* (2025.01); *H10D 1/68* (2025.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73253* (2013.01)

(58) Field of Classification Search

CPC .. H01L 25/0756; H01L 25/112; H01L 25/117; H01L 2224/08145; H01L 27/0688; H01L 23/3185; H01L 23/3157; H01L 21/56; H01L 21/563; H01L 23/5389; H01L 23/49827; H01L 23/5384; H01L 23/481; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2225/06541–06544; H01L 2225/06548; H01L 21/76898; H01L 21/486; H01L 2224/023–024; H01L 2224/0235; H01L 2224/02372; H01L 2224/02373; H01L 23/49822; H01L 23/5383

See application file for complete search history.

(56) References Cited

FOREIGN PATENT DOCUMENTS

| | | | | |
|---|---|---|---|---|
| CN | 113228266 | A | 8/2021 | |
| CN | 112038330 | B * | 9/2024 | ....... H01L 23/49838 |
| EP | 4318569 | A1 * | 2/2024 | ......... H01L 23/5386 |
| JP | 2004335761 | A | 11/2004 | |

* cited by examiner

100

200

500

600

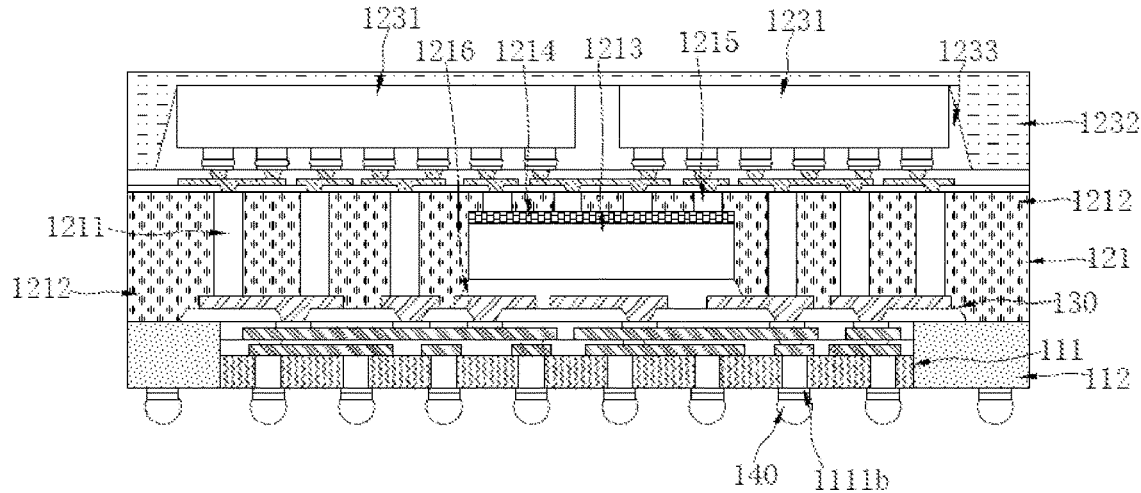

FIG. 23

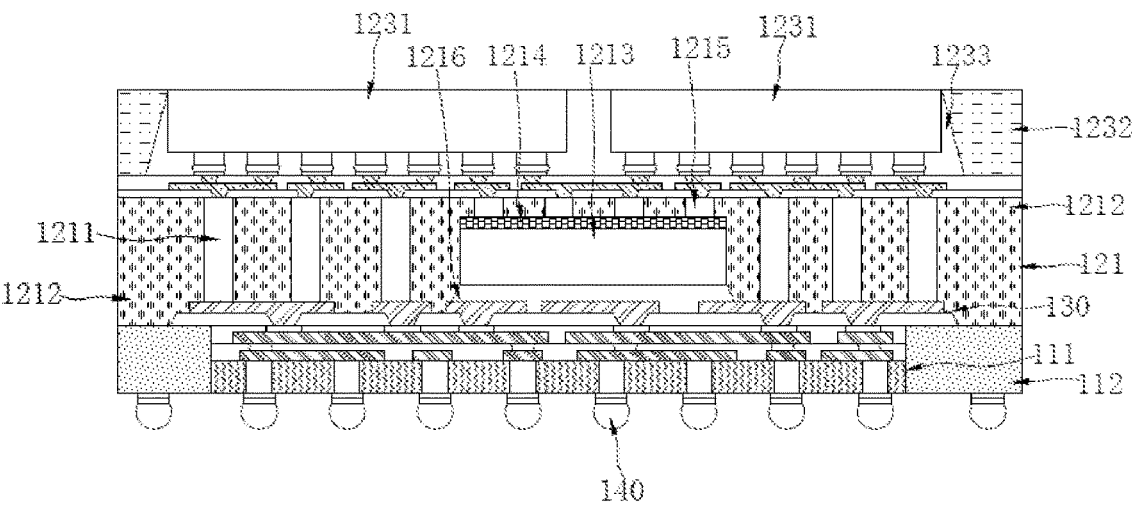

| Providing a first prefabricated redistribution stack layer, plastic-packaging the first prefabricated redistribution stack layer to form a first plastic packaging layer, and constituting a lower package |
| --- |

| Forming a first redistribution stack layer on a side of the lower package, the first redistribution stack layer being electrically connected to the first prefabricated redistribution stack layer |
| --- |

| Packaging an upper package above the first redistribution stack layer to obtain the packaging structure |
| --- |

FIG. 25

PACKAGING STRUCTURE AND MANUFACTURING METHOD THEREOF

TECHNICAL FIELD

The present invention belongs to the field of semiconductor packaging technologies, and in particular to a packaging structure and a manufacturing method thereof.

BACKGROUND

With the rapid development of high-speed computation and artificial intelligence, higher requirements are put forward on packaging of semiconductor chips and packages, especially for packaging substrates, which are usually required to have smaller line width/line spacing and better control of voltage drop. However, the line width/line spacing of the traditional laminated substrate wiring is usually about 15 μm/15 μm, which becomes increasingly incompetent to satisfy high-density packaging requirements for electronic components applied to high-speed computation and artificial intelligence.

In addition, the traditional laminated substrate technology is faced with greater challenges in the following aspects: 1) supply of stacked dielectric materials; 2) manufacturing cycle; 3) wiring with the line width/line spacing being less than 10 μm and yield control of the buried chip; and 4) thickness of the laminated substrate.

Therefore, it is necessary to propose a new packaging structure and a manufacturing method thereof to overcome the problem that the traditional laminated substrates cannot satisfy the high-density packaging requirements for electronic components applied to high-speed computation and artificial intelligence due to thickness, line width/line spacing and other factors.

SUMMARY

An object of the present invention is to provide a packaging structure and a manufacturing method thereof to overcome defects of the traditional laminated substrate, such that the high-density packaging demand as required by electronic components can be met, and a volume of the packaging structure can be reduced.

In order to solve the aforesaid problems, technical solutions of the present invention provide a packaging structure. The packaging structure includes: a lower package, an upper package disposed above the lower package, and a first redistribution stack layer disposed between the lower package and the upper package, wherein the first redistribution stack layer is electrically connected to the lower package and the upper package; wherein the lower package includes a first prefabricated redistribution stack layer and a first plastic packaging layer surrounding the first prefabricated redistribution stack layer; and wherein a minimum line width and line spacing of at least one first prefabricated conductive layer in the first prefabricated redistribution stack layer is less than a minimum line width and line spacing of at least one first conductive layer in the first redistribution stack layer.

As an optional technical solution, the first prefabricated redistribution stack layer includes a magnetic film layer that is stacked above a first base material layer of the first prefabricated redistribution stack layer, or is stacked above a first dielectric layer of the first prefabricated redistribution stack layer; wherein the first prefabricated redistribution stack layer, the magnetic film layer, and the first redistribution stack layer constitute an inductor of the packaging structure.

As an optional technical solution, the upper package includes: an interconnected chip packaging layer disposed above the first redistribution stack layer, a second redistribution stack layer disposed above the interconnected chip packaging layer, and a packaging layer having a chip and/or device package and disposed above the second redistribution stack layer; wherein the interconnected chip packaging layer includes: a plurality of interconnected conductive pillars, an interconnected chip and a second plastic packaging layer, wherein the plurality of interconnected conductive pillars and the interconnected chip are plastic-packaged above the first redistribution stack layer by the second plastic packaging layer, and two ends of each interconnected conductive pillar are electrically connected to the first redistribution stack layer and the second redistribution stack layer; wherein the packaging layer having the chip and/or device package includes a chip and/or device package and a third plastic packaging layer, wherein the chip and/or device package is flip-bonded to the second redistribution stack layer, and the chip and/or device package are plastic-packaged above the second redistribution stack layer by the third plastic packaging layer; and wherein the interconnected chip is upright-bonded to the first redistribution stack layer; the interconnected chip includes an interconnected redistribution stack layer on a surface at a side facing toward the second redistribution stack layer; and at least one conductive layer of the interconnected redistribution stack layer has a minimum line width and line spacing of less than 2 μm, and the interconnected redistribution stack layer further includes at least one capacitor.

As an optional technical solution, the interconnected chip is provided with a trench-type capacitor.

As an optional technical solution, the interconnected chip is provided with an interconnected via through which the interconnected redistribution stack layer is electrically connected to the first redistribution stack layer together with a connection pad in a body of the chip approximate to the first redistribution stack layer.

As an optional technical solution, the packaging structure further includes at least one first capacitor and/or at least one second capacitor; wherein the at least one first capacitor is embedded within the first prefabricated redistribution stack layer or within the first plastic packaging layer; and the at least one first capacitor is disposed below the chip and/or device package of the upper package in a thickness direction of the packaging structure; wherein the at least one second capacitor is embedded within the second plastic packaging layer and/or the third plastic packaging layer; and wherein the at least one first capacitor is electrically connected to the first prefabricated redistribution stack layer, and the at least one second capacitor is electrically connected to the first redistribution stack layer and/or the second redistribution stack layer.

As an optional technical solution, the packaging structure further includes: at least one first virtual element and/or at least one second virtual element; wherein the at least one first virtual element is provided above the first redistribution stack layer and is disposed at a corner or perimeter of the first redistribution stack layer; and wherein the at least one second virtual element is provided above the second redistribution stack layer and is disposed at a corner or perimeter of the second redistribution stack layer.

As an optional technical solution, the lower package further includes: a composite intermediary block which is provided at an edge and/or corner of the lower package and is adjacent to the first plastic packaging layer, wherein the composite intermediary block includes a conductive structure and a dielectric cladding layer wrapped around an outer side of the conductive structure, and a side of the conductive structure is electrically connected to the first redistribution stack layer; and wherein a coefficient of thermal expansion of the dielectric cladding layer is less than a coefficient of thermal expansion of the first prefabricated redistribution stack layer.

As an optional technical solution, the packaging structure further includes: a metal block and a metal coating that are electrically connected, wherein the metal block is embedded within the upper package and electrically connected to a second redistribution stack layer of the upper package, and the metal coating is provided above an exposed surface of the upper package, the exposed surface being away from the lower package.

As an optional technical solution, the lower package further includes: a second prefabricated redistribution stack layer, wherein the second prefabricated redistribution stack layer and the first prefabricated redistribution stack layer are stacked to and electrically connected to each other; wherein the first redistribution stack layer and the second prefabricated redistribution stack layer are plastic-packaged by the first plastic packaging layer; or the lower package further includes an underfill material layer that is sandwiched between the first prefabricated redistribution stack layer and the second prefabricated redistribution stack layer, such that the first prefabricated redistribution stack layer and the second prefabricated redistribution stack layer are reconstituted as a prefabricated redistribution stack layer unit which is plastic-packaged by the first plastic packaging layer.

As an optional technical solution, the first prefabricated redistribution stack layer includes: a first base material layer, and a first conductive layer and a first dielectric layer that are alternately stacked on a side of the first base material layer, wherein the first base material layer is embedded with a plurality of copper pillars, a plurality of pads protrude from ends of the plurality of copper pillars respectively, and the plurality of pads are provided with metal bumps with tin caps or tin balls respectively.

The present invention further provides a manufacturing method of a packaging structure. The method includes steps of: providing a first prefabricated redistribution stack layer, plastic-packaging the first prefabricated redistribution stack layer to form a first plastic packaging layer, and constituting a lower package; forming a first redistribution stack layer on a side of the lower package, the first redistribution stack layer being electrically connected to the first prefabricated redistribution stack layer; and packaging an upper package above the first redistribution stack layer to obtain the packaging structure; wherein a minimum line width and line spacing of at least one prefabricated conductive layer in the first prefabricated redistribution stack layer is less than a minimum line width and line spacing of at least one first conductive layer in the first redistribution stack layer, and the first prefabricated redistribution stack layer and the first redistribution stack layer constitute a voltage control circuit of the packaging structure.

As an optional technical solution, the step of providing the first prefabricated redistribution stack layer, plastic-packaging the first prefabricated redistribution stack layer to form the first plastic packaging layer, and constituting the lower package includes: providing a carrier board on which a plurality of the first prefabricated redistribution stack layers that are pre-cut into single grains and include a support plate are temporarily bonded; applying a first plastic packaging material to the carrier board to plastic-package the first prefabricated redistribution stack layer and thereby form the first plastic packaging layer; and separating the first plastic packaging layer and the first prefabricated redistribution stack layer from the carrier board to obtain the lower package.

As an optional technical solution, the step of packaging the upper package above the first redistribution stack layer to obtain the packaging structure includes: forming a plurality of conductive metal pillars above the first redistribution stack layer; mounting an interconnected chip above the first redistribution stack layer, wherein a top portion of the interconnected chip away from the first redistribution stack layer includes an interconnected redistribution stack layer and a plurality of connection bumps; plastic-packaging the plurality of conductive metal pillars and the interconnected chip to form a second plastic packaging layer; thinning the second plastic packaging layer to expose the plurality of conductive metal pillars and the plurality of connection bumps; forming a second redistribution stack layer above the second plastic packaging layer, wherein the second redistribution stack layer is electrically connected to the plurality of conductive metal pillars and the connection bumps; flip-bonding a chip and/or device package above the second redistribution stack layer; and plastic-packaging the chip and/or device package to form an optional third plastic packaging layer.

As an optional technical solution, the manufacturing method further includes: thinning a side of the first plastic packaging layer away from the first redistribution stack layer, and removing the support plate to expose a plurality of pads of the first prefabricated redistribution stack layer; implanting a solder ball or metal bump on the plurality of pads, wherein the solder ball or metal bump is electrically connected to the plurality of pads; and thinning the third plastic packaging layer to expose a back side of the chip and/or a back side of the device package.

Compared with the prior art, the present invention provides a packaging structure and a manufacturing method thereof. The lower package of the packaging structure includes a first prefabricated redistribution stack layer and a first redistribution stack layer disposed above the first prefabricated redistribution stack layer; and a minimum line width and line spacing of at least one prefabricated conductive layer in the first prefabricated redistribution stack layer is less than a minimum line width and line spacing of at least one first conductive layer in the first redistribution stack layer. Since the single-grained prefabricated redistribution stack layer is plastic-packaged to form a reconstituted substrate is manufactured by plastic-packaging, the line width and line spacing and the thickness of the prefabricated redistribution stack layer may be reduced, thereby effectively meeting the packaging requirements in high density and small packaging size.

The following is a detailed description of the present invention in conjunction with the accompanying drawings and specific embodiments, but is not intended to be a limitation of the present invention.

BRIEF DESCRIPTION OF THE DRAWINGS

To describe the technical solutions in the embodiments of the present invention or the prior art more clearly, the following briefly introduces the accompanying drawings required for describing the embodiments. Apparently, the accompanying drawings in the following description show some embodiments of the present invention, and a person of ordinary skill in the art may still derive other drawings from these accompanying drawings without creative efforts.

FIG. 23 is a schematic cross-sectional view for forming a metal bump on a conductive layer of a first prefabricated redistribution stack layer;

FIG. 24 is a schematic cross-sectional view for thinning a back side of a third plastic packaging layer; and FIG. 25 is a flowchart of a manufacturing method of a packaging structure according to the present invention.

DETAILED DESCRIPTION

Figure 1:
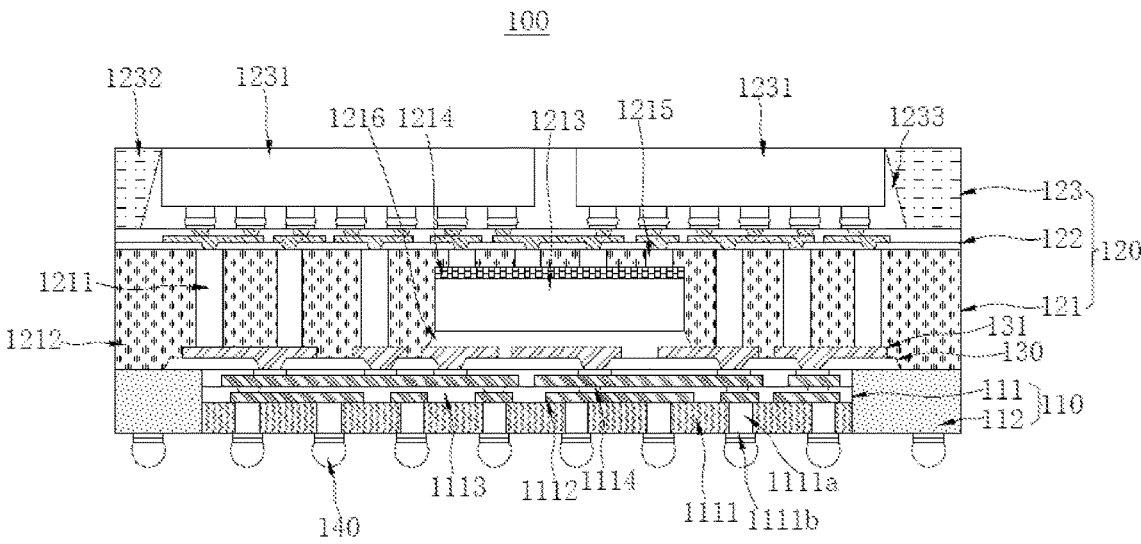
FIG. 1 is a schematic cross-sectional view of a packaging structure according to a first embodiment of the present invention.

In order to make the object, technical solutions and advantages of the present invention more clearly understood, the present invention will be further detailed below in conjunction with embodiments and accompanying drawings. It should be understood that the specific embodiments described herein merely aim to explain the present invention, and do not limit the present invention.

In the description of the present invention, it should be understood that, orientation or position relationships indicated by the terms "center", "upper", "lower", "left", "right", "vertical", "horizontal", "inner", "outer", etc. are based on the orientation or position relationships as shown in the drawings, for ease of the description of the present invention and simplifying the description only, rather than indicating or implying that the indicated device or element must have a particular orientation or be constructed and operated in a particular orientation. Therefore, these terms should not be understood as a limitation to the present invention.

An object of the present invention is to provide a packaging structure. The packaging structure includes: a lower package, an upper package, and a first redistribution stack layer that is disposed between the lower package and the upper package and is electrically connected to the lower package and the upper package. The lower package herein includes a first prefabricated redistribution stack layer and a first plastic packaging layer surrounding the first prefabricated redistribution stack layer; and a minimum line width and line spacing of at least one first prefabricated conductive layer in the first prefabricated redistribution stack layer is less than a minimum line width and line spacing of at least one first conductive layer in the first redistribution stack layer.

Since the single-grained prefabricated redistribution stack layer is plastic-packaged to form a reconstituted substrate, the line width and line spacing and the thickness of the prefabricated redistribution stack layer may be reduced, thereby effectively meeting the packaging requirements such as high density and small packaging size.

In addition, by manufacturing the redistribution stack layer on the reconstituted substrate, the redistribution stack layer may be stacked to the prefabricated redistribution stack layer inside the reconstituted substrate one another, and thereby may serve as a voltage control circuit, such as an inductor or a capacitor. The inductor or its combination with a capacitor in the circuit mainly play a role in filtering, oscillating, delaying, trapping and the like, and further have functions of screening signals, filtering noise, stabilizing current, suppressing electromagnetic interference, and the like. In addition, the inductor further has a property of blocking passing of alternating current but allowing direct current to pass smoothly.

Further, the upper package includes an interconnected conductive pillar for vertical interconnection, an interconnected chip, a second plastic packaging layer, and a second redistribution stack layer. The interconnected conductive pillar and the interconnected chip are plastic-packaged by the second plastic packaging layer; the second redistribution stack layer is provided above the second plastic packaging layer; and the first redistribution stack layer and the second redistribution stack layer are interconnected vertically via the interconnected conductive pillar. The interconnected chip includes an interconnected redistribution stack layer which is electrically connected to the second redistribution stack layer; and a capacitor and inductor formed between any two of the first redistribution stack layer, the interconnected redistribution stack layer, and the second redistribution stack layer that are stacked from the bottom to top may serve as a filter or electrostatic protection structure.

Various packaging structures according to the present invention will be described in detail below in conjunction with FIGS. 1 to 9.

As shown in FIG. 1, a first embodiment of the present invention provides a packaging structure 100, which includes a lower package 110, an upper package 120, and a first redistribution stack layer 130 that is disposed between the lower package 110 and the upper package 120 and is electrically connected to the lower package 110 and the upper package 120. The lower package 110 includes a first prefabricated redistribution stack layer 111 and a first plastic packaging layer 112 surrounding the first prefabricated redistribution stack layer 111; and a minimum line width and line spacing of at least one first prefabricated conductive layer 1112 in the first prefabricated redistribution stack layer 111 is less than a minimum line width and line spacing of at least one first conductive layer 131 in the first redistribution stack layer.

The thickness of the lower package 110 may be adjusted between 0.05 mm and 1.0 mm depending on requirements in design or process and construction. For at least one conductive layer and at least one dielectric layer of the first prefabricated redistribution stack layer 111, the thickness of a single conductive layer may be adjusted between 0.5 μm and 50 μm depending on requirements in design or process and construction, and the thickness of a single dielectric layer may be adjusted between 2 μm and 60 μm depending on requirements in design or process and construction. For at least one conductive layer and at least one dielectric layer of the first redistribution stack layer 130, the thickness of a single conductive layer may be adjusted between 0.5 μm and 80 μm depending on requirements in design or process and construction, and the thickness of a single dielectric layer may be adjusted between 2 μm and 60 μm depending on requirements in design or process and construction. The width of the first plastic packaging layer 112 may be adjusted between 0.5 μm and 1.0 mm depending on requirements in design or process and construction.

In a preferred embodiment, a minimum line width and line spacing of the first prefabricated conductive layer 1112 is less than 5 μm, and a minimum line width and line spacing of the first conductive layer 131 is less than 10 μm.

As shown in FIG. 1, the first prefabricated redistribution stack layer 111 further includes a first base material layer 1111 and a first dielectric layer 1113, and materials of the first base material layer 1111 and the first dielectric layer 1113 may be selected from the same or different dielectric materials. The dielectric material herein includes, but is not limited to, a polymer composite film with inorganic fillers or glass fibers, polyimide, bismaleimide triazine (BT) resin, epoxy resin, polyurethane, benzocyclobutene (BCB), high-density polyethylene (HDPE), reinforced glass fiber, or a combination of at least one or more of the inorganic fillers. Preferably, a coefficient of thermal expansion of the first base material layer 1111 is less than a coefficient of thermal expansion of the first dielectric layer 1113, such that the first prefabricated redistribution stack layer has a certain hardness and thereby can tolerate adverse effects caused by the subsequent packaging process for overcoming warpage. Optionally, an additional polymer composite solder mask layer with fillers is formed on surfaces of the first prefabricated redistribution stack layer 111 and the first plastic packaging layer 112.

The first prefabricated conductive layer 1112 is formed from a conductive material (e.g., metal material or alloy or multilayer metal stack layer) with an optional bonded metal layer such as Ti or TiW. The first prefabricated conductive layer 1112 and the first dielectric layer 1113 are alternately stacked on a side of the first base material layer 1111, and the first prefabricated conductive layers 1112 are conductive to each other via a first via or blind via 1114 formed inside the first dielectric layer 1113. The first via or blind via 1114 herein is filled with a conductive material such as copper.

With further reference to FIG. 1, the first base material layer 1111 is embedded with a plurality of copper pillars 1111*a*, and an outer surface of the first base material layer 1111 is provided with a plurality of pads 1111*b* (or bumps 1111*b*) to which metal bumps 140 are electrically connected, the metal bumps 140 being for example tin balls or metal blocks with tin caps.

In a preferred embodiment, the lower package 110 further includes a magnetic film layer or an embedded capacitive film layer (not shown) stacked above the first base material layer 1111 or the first dielectric layer 1113. The magnetic film layer or the embedded capacitive film layer may be a patterned structure or may cover the first base material layer 1111 or the first dielectric layer 1113 as an entire surface. The first prefabricated redistribution stack layer 111, the magnetic film layer and the first redistribution stack layer 130 may together form an inductor, or form a capacitor with the embedded capacitive film layer. The inductor or capacitor may be adopted alone or together to play a role in filtering, oscillating, delaying, trapping and the like, and further have functions of screening signals, filtering noise, stabilizing current, suppressing electromagnetic interference, and the like. Preferably, the magnetic material of the magnetic film layer is selected, for example, from nickel-iron alloys or other magnetic alloys or composite materials as formed by processes such as electroplating or print sintering. For example, the thickness of the magnetic film layer or the embedded capacitive film layer optionally varies from 5 μm to 150 μm.

With further reference to FIG. 1, the upper package 120 is provided above the first redistribution stack layer 130 and includes: an interconnected chip packaging layer 121, a second redistribution stack layer 122 disposed above the interconnected chip packaging layer 121, and a packaging layer 123 having a chip and/or device package and disposed above the second redistribution stack layer 122. For at least one conductive layer and at least one dielectric layer of the second redistribution stack layer 122, the thickness of a single conductive layer may be adjusted between 0.5 μm and 20 μm depending on requirements in design or process and construction, and the thickness of a single dielectric layer may be adjusted between 2 μm and 30 μm depending on requirements in design or process and construction.

The interconnected chip packaging layer 121 includes a plurality of interconnected conductive pillars 1211, an interconnected or functional chip 1213, and a second plastic packaging layer 1212. The plurality of interconnected conductive pillars 1211 and the interconnected or functional chip 1213 are plastic-packaged above the first redistribution stack layer 130 by the second plastic packaging layer 1212. Two ends of each interconnected conductive pillar 1211 are electrically connected to the first redistribution stack layer 130 and the second redistribution stack layer 122, respectively. The interconnected or functional chip 1213 is upright-bonded above the first redistribution stack layer 130, and a first upright bonding material layer 1216 is provided between a bottom of the interconnected or functional chip 1213 and the first redistribution stack layer 130. The first upright bonding material layer 1216 enables the fixed connection between the interconnected or functional chip 1213 and the first redistribution stack layer 130 to be more stable, and prevents the interconnected or functional chip 1213 from being affected by harmful operating environments such as moisture and vibration. The upright bonding material layer 1216 may be an insulating or conductive material or composite material depending on the design of the interconnected or functional chip 1213 (e.g., with or without a heat dissipation and back-metal design). A top portion of the interconnected or functional chip 1213 includes an interconnected redistribution stack layer 1214 and a connection bump 1215 that is disposed above the interconnected redistribution stack layer 1214. The connection bump 1215 is electrically connected to the second redistribution stack layer 122. At least one conductive layer in the interconnected redistribution stack layer 1214 has a minimum line width and line spacing of less than 2 μm, and the interconnected redistribution stack layer 1214 further includes at least one capacitor.

In a preferred embodiment, the minimum line width and line spacing of the at least one second conductive layer in the second redistribution stack layer 122 is less than 10 μm.

The packaging layer 123 having a chip and/or device package includes: a chip 1231 and/or device package 1231 and a third plastic packaging layer 1232. The chip 1231 and/or device package 1231 is flip-bonded above the second redistribution stack layer 122 and is electrically connected to the second redistribution stack layer 122, respectively. The chip 1231 and/or device package 1231 are plastic-packaged above the second redistribution stack layer 122 by the third plastic packaging layer 1232, and the third plastic packaging layer 1232 is provided surrounding the chip and/or device package 1231, such that a back side of the chip and/or device package 1231 is exposed from a front side of the third plastic packaging layer 1232. The front side of the third plastic packaging layer 1232 is, for example, a side away from the second redistribution stack layer 122.

In addition, a second underfill material layer 1233 may be filled between the second redistribution stack layer 122 and the chip 1231 and/or device package 1231 to avoid the chip 1231 and/or device package 1231 from being subjected to harmful operating environments such as moisture, vibration, or other stresses.

As shown in FIG. 1, the capacitor or inductor as formed by a combination of any two of the first redistribution stack layer 130, the interconnected redistribution stack layer 1214, and the second redistribution stack layer 122 stacked from the bottom up in the packaging structure 100 may also serve as a filter or an electrostatic protection structure.

In this embodiment, each structure of the upper package 120 is for example, but not limited to be, manufactured in a wafer-level package or panel-level package above the reconstituted substrate as formed by the first prefabricated redistribution stack layer 111 that is plastic-packaged in advance. In the packaging structure according to the subsequent seventh embodiment of the present invention, the upper package may also be a separate unit plastic-packaged in advance. When the prefabricated redistribution stack layer has been plastic-packaged to form the reconstituted substrate and after the first redistribution stack layer is manufactured on the reconstituted substrate, the two separate units may be mounted to each other to achieve the electrical connection, and this stacked connection between the separate units helps to improve the yield of the overall packaging structure.

Figure 2:
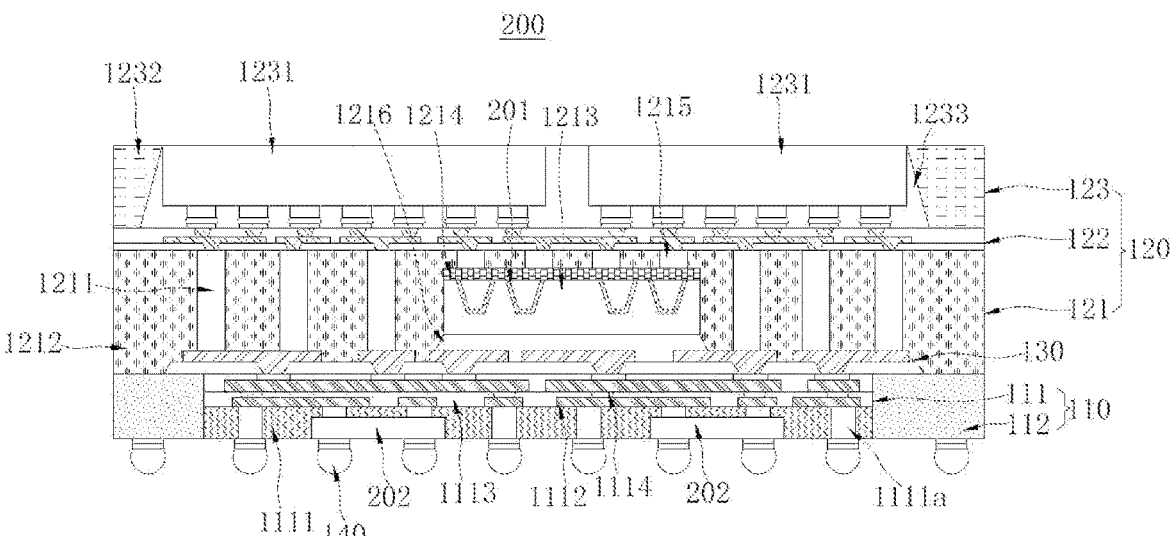
FIG. 2 is a schematic cross-sectional view of a packaging structure according to a second embodiment of the present invention.

As shown in FIG. 2, a second embodiment of the present invention also provides a packaging structure 200, which differs from the packaging structure 100 in following points. 1) The interconnected or functional chip 1213 of the upper package 120 is provided with a trench-type capacitor 201 for decoupling the voltage control. 2) At least one first capacitor 202 is embedded within the first base material layer 1111 of the lower package 110; preferably, the first capacitor 202 is stacked below the chip 1231 or device package 1231 in the thickness direction of the packaging structure 200 to well control the voltage drop, where the first capacitor 202 may be for example a silicon capacitor. 3) The at least one first capacitor 202 may for example be a plurality of first capacitor 202, and the plurality of first capacitors 202 are arranged along a perimeter and/or corner of the first base material layer 1111 to avoid the first prefabricated redistribution stack layer 111 from warping.

In addition, the same reference numerals in FIG. 2 and FIG. 1 represent the same components having similar functions and will not repeated herein.

Figure 3:
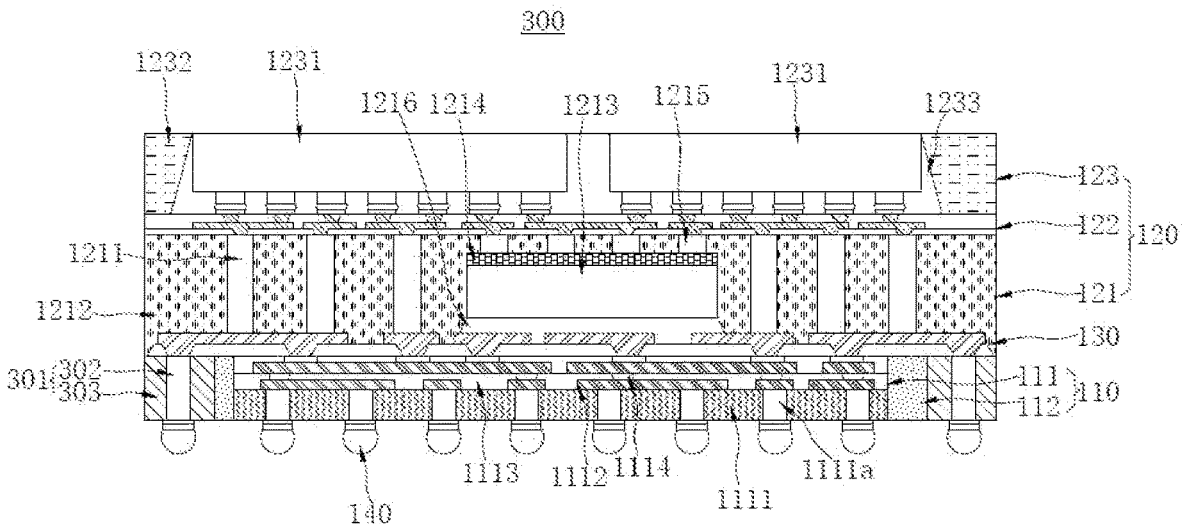
FIG. 3 is a schematic cross-sectional view of a packaging structure according to a third embodiment of the present invention.

As shown in FIG. 3, a third embodiment of the present invention also provides a packaging structure 300, which differs from the packaging structure 100 in that: the lower package 110 further includes a composite intermediary block 301 which is provided at an edge and/or corner of the lower package 110 and is adjacent to the first plastic packaging layer 112. The composite intermediary block 301 is configured to avoid the lower package 110 from warping.

The composite intermediary block 301 includes a conductive structure 302 and a dielectric cladding layer 303 wrapped around an outer side of the conductive structure 302. Preferably, a coefficient of thermal expansion of the dielectric cladding layer 303 is less than a coefficient of thermal expansion of the first prefabricated redistribution stack layer 111. Due to the small coefficient of thermal expansion, the dielectric cladding layer 303 can effectively help the packaging structure 300 to overcome warpage.

In this embodiment, the composite intermediary block 301 is provided on the outer side of the first plastic packaging layer 112, but is not limited to this. In other embodiments of the present invention, the composite intermediary block may be embedded within the first plastic packaging layer, or may be provided at an inner side of the first plastic packaging layer to be adjacent to the first prefabricated redistribution stack layer.

In addition, the same reference numerals in FIG. 3 and FIG. 1 represent the same components having similar functions and will not repeated herein.

Figure 4:
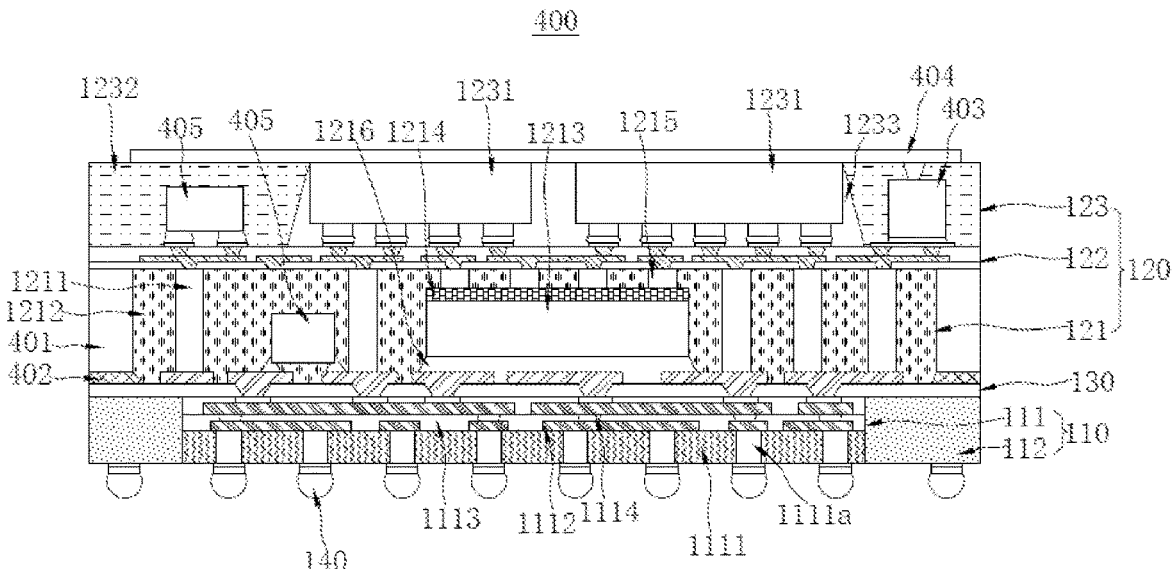
FIG. 4 is a schematic cross-sectional view of a packaging structure according to a fourth embodiment of the present invention.

As shown in FIG. 4, a fourth embodiment of the present invention also provides a packaging structure 400, which differs from the packaging structure 100 in following points. 1) The packaging structure 400 further includes at least one first virtual element 401 which is fixed above the first redistribution stack layer 130 for assisting the packaging structure 400 to overcome warpage and improve heat dissipation; the first virtual element 401 may be fixed above the first redistribution stack layer 130 by a bonding layer 402, and the first virtual element 401 may for example be a virtual silicon wafer; and preferably, there may be a plurality of first virtual elements 401 that are arranged at the edges and/or corners of the first redistribution stack layer 130. (2) The packaging structure 400 further includes a metal block 403 and a metal coating 404 that are electrically connected; the metal block 403 is embedded in the third plastic packaging layer 1232, and the metal coating 404 is coated above an exposed surface of the upper package 120, the exposed surface of the upper package 120 being away from the lower package 110; the metal coating 404 covers at least a portion of an upper surface of the third plastic packaging layer 1232; the metal block 403 is electrically connected to a second conductive layer in the second redistribution stack layer 122 and thereby conducts electrostatic charges within the packaging structure 400 toward the outer metal coating 404, such that electrostatic charges are prevented from accumulating within the packaging structure 400; and the metal coating 404 is disposed on an outer side of the packaging structure 400 and exposed, which helps to enhance the heat dissipation of the packaging structure 400. 3) The packaging structure 400 further includes at least one second capacitor 405; the second capacitor 405 is, for example, a device capacitor; the number of at least one second capacitor 405 is two, one of which is embedded in the second plastic packaging layer 1212, and the other is embedded in the third plastic packaging layer 1232; and the at least one second capacitor 405 is configured to decouple to control the voltage drop.

It should be noted that at least one second capacitor in other embodiments of the present invention may also be embedded merely in the second plastic packaging layer or the third plastic packaging layer.

In addition, the same reference numerals in FIG. 4 and FIG. 1 represent the same components having similar functions and will not repeated herein.

Figure 5:
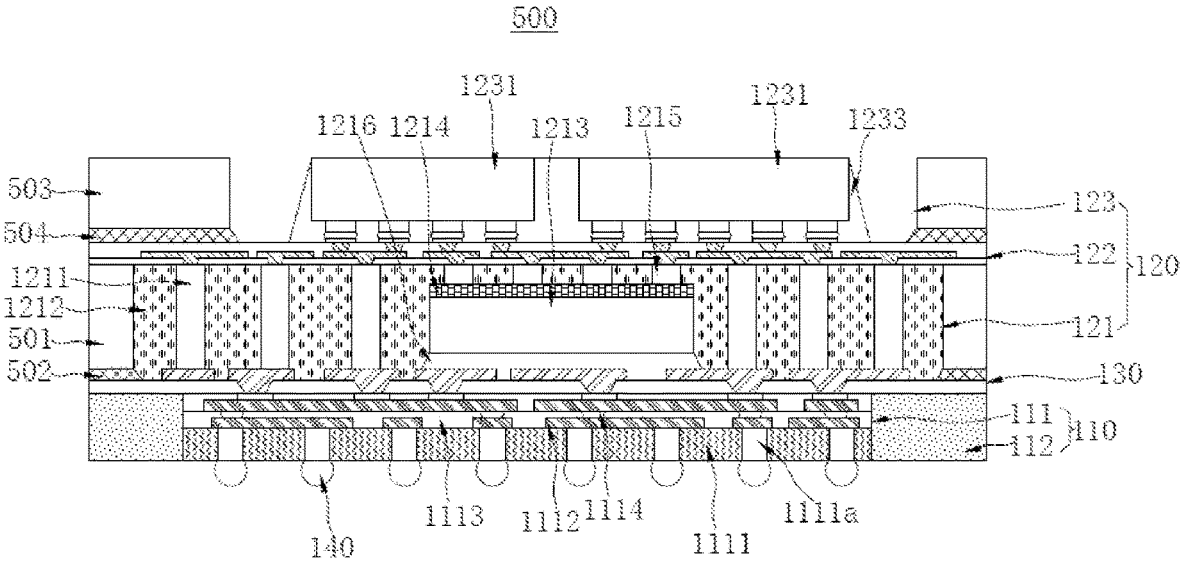
FIG. 5 is a schematic cross-sectional view of a packaging structure according to a fifth embodiment of the present invention.

As shown in FIG. 5, a fifth embodiment of the present invention also provides a packaging structure 500, which differs from the packaging structure 100 in that the packaging structure 500 further includes at least one first virtual element 501 and at least one second virtual element 503. The at least one first virtual element 501 is fixed above the first redistribution stack layer 130 by a bonding layer 502, and the at least one second virtual element 503 is fixed above the second redistribution stack layer 122 by a bonding layer 504. The at least one first virtual element 501 and the at least one second virtual element 503 are adopted together to assist the packaging structure 500 in overcoming the warpage and improving the heat dissipation.

In this embodiment, the first virtual element 501 and the second virtual element 503 are, for example, virtual silicon wafers. Preferably, there are a plurality of first virtual elements 501 and a plurality of second virtual elements 503 and they are arranged at the edges and/or corners of the first redistribution stack layer 130 and at the edges and/or corners of the second redistribution stack layer 122, respectively.

As shown in FIG. 5, the first virtual element 501 is adjacent to and provided on the outer side of the second plastic packaging layer 1212, and the second virtual element 503 is adjacent to and provided on the outer side of the third plastic packaging layer 1232. Both the first virtual element 501 and the second virtual element 503, which are disposed on the outer side of the plastic packaging layer, can conduct heat transfer with the external environment, thereby enhancing the heat dissipation capability of the packaging structure 500.

In the packaging structure 500, no third plastic packaging layer for plastic-packaging the chip and/or device package 1231 is provided above the second redistribution stack layer 122. It should be noted that the third plastic packaging layer for plastic-packaging the chip and/or device package 1231 may also be provided in other embodiments.

In addition, a plurality of metal bumps 140, such as a plurality of tin balls, are provided on a back side of the first base material layer 1111 and are electrically connected to the copper pillars 1111*a*, respectively.

In addition, the same reference numerals in FIG. 5 and FIG. 1 represent the same components having similar functions and will not repeated herein.

Figure 6:
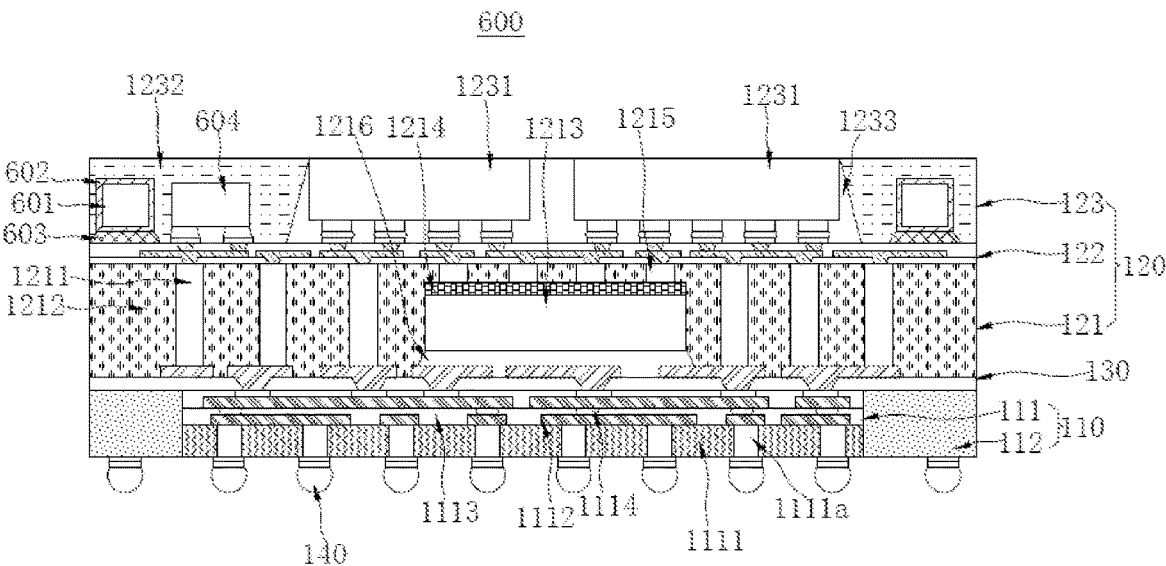
FIG. 6 is a schematic cross-sectional view of a packaging structure according to a sixth embodiment of the present invention.

As shown in FIG. 6, the sixth embodiment of the present invention also provides a packaging structure 600, which differs from the packaging structure 100 in that the packaging structure 600 further includes at least one composite reinforcing block and at least one second capacitor 604. The at least one composite reinforcing block and the at least one second capacitor 604 are provided above the second redistribution stack layer 122 respectively, and both embedded in the third plastic packaging layer 1232.

The composite reinforcing block includes a metal alloy block 601 and a metal plating layer 602 wrapped around an outer side of the metal alloy block 601, and the composite reinforcing block is fixed above the second redistribution stack layer 122 by a bonding layer 603. Preferably, at least one composite reinforcing block is provided at the edge and/or corner of the second redistribution stack layer 122 for assisting the packaging structure 600 in overcoming the warpage and improving the heat dissipation.

The second capacitor 604 is for example a silicon capacitor chip and is electrically connected to the second redistribution stack layer 122 for decoupling to control the voltage drop.

In addition, the same reference numerals in FIG. 6 and FIG. 1 represent the same components having similar functions and will not repeated herein.

Figure 7:
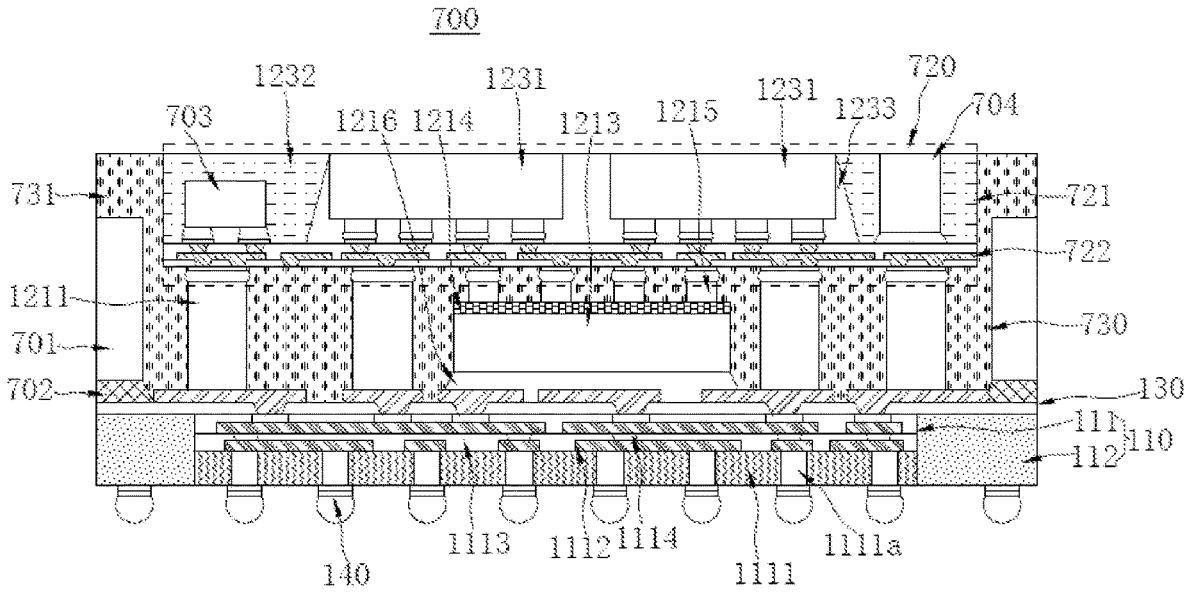
FIG. 7 is a schematic cross-sectional view of a packaging structure according to a seventh embodiment of the present invention.

As shown in FIG. 7, a seventh embodiment of the present invention also provides a packaging structure 700, which differs from packaging structure 100 in following points. 1) The packaging structure 700 includes a prefabricated upper package 720 that is separately fabricated in another fan-out wafer-level package or panel-level package by a second redistribution stack layer 722 and a packaging layer 721 having a chip 1231 and/or device package 1231. 2) A metal bump or tin ball is provided on a back side of the second redistribution stack layer 722 of the prefabricated upper package 720, and the metal bump or tin ball is electrically connected to the interconnected conductive pillar 1211 in the interconnected chip packaging layer 730 in the packaging structure 700. (3) A second virtual element 704 and a second capacitor 703 are provided at an edge and/or corner of the second redistribution stack layer 722 in the prefabricated upper package 720; and the second virtual element 704 is configured to suppress the warpage, and the second capacitor 703 is configured to decouple to control the voltage drop. (4) At least one first virtual element 701 is provided above the first redistribution stack layer 130 of the packaging structure 700 and is disposed at the edge and/or corner of the first redistribution stack layer 130 for overcoming warpage and enhancing heat dissipation.

In this embodiment, the manufacturing process of the packaging structure 700 generally includes: completing plastic packaging of the first prefabricated redistribution stack layer 111; then, electrically bonding the first redistribution stack layer 130, the interconnected conductive pillar 1211 and the interconnected or functional chip 1213 as fabricated to the prefabricated upper package 720; and finally, applying a second plastic packaging material to plastic-package the interconnected conductive pillar 1211, the interconnected or functional chip 1213, and the prefabricated upper package 720 together in the second plastic packaging layer 731.

Thus, the production yield of the packaging structure 700 can be improved due to the prefabricated upper package 720 and the prefabricated lower package 110 as adopted.

In addition, the same reference numerals in FIG. 7 and FIG. 1 represent the same components having similar functions and will not repeated herein.

Figure 8:
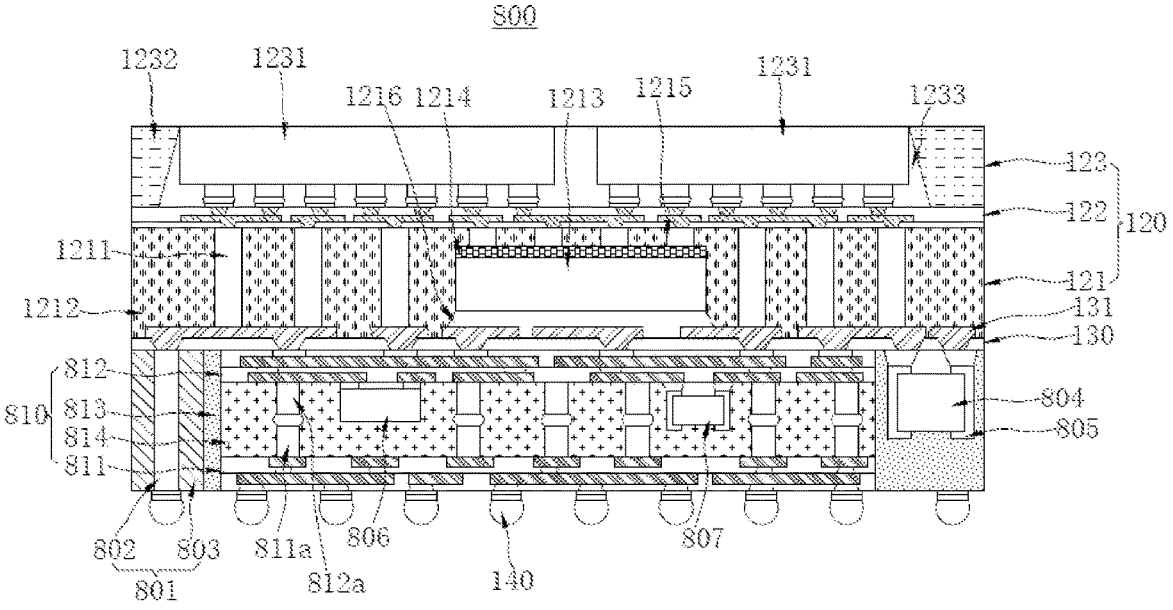
FIG. 8 is a schematic cross-sectional view of a packaging structure according to an eighth embodiment of the present invention.

As shown in FIG. 8, an eighth embodiment of the present invention further provides a packaging structure 800, which differs from the packaging structure 100 in that the lower package 810 in the packaging structure 800 includes: a first prefabricated redistribution stack layer 811 and a second prefabricated redistribution stack layer 812 that are stacked to each other, an underfill material layer 814 sandwiched between the first prefabricated redistribution stack layer 811 and the second prefabricated redistribution stack layer 812, and a first plastic packaging layer 813 for plastic-packaging the first prefabricated redistribution stack layer 811, the second prefabricated redistribution stack layer 812 and the underfill material layer 814.

In this embodiment, the first prefabricated redistribution stack layer 811, the second prefabricated redistribution stack layer 812 and the underfill material layer 814 form a prefabricated redistribution stack layer unit.

In a preferred embodiment, a first metal pillar 811$a$ protrudes from the first prefabricated redistribution stack layer 811; a second metal pillar 812$a$ protrudes from the second prefabricated redistribution stack layer 812; and the first metal pillar 811$a$ and the second metal pillar 812$a$ are electrically connected by a tin-metal bonding or a copper-copper diffusion direct bonding.

In a preferred embodiment, structures of the first prefabricated redistribution stack layer 811 and the second prefabricated redistribution stack layer 812 may be illustrated with reference to the structure of the first prefabricated redistribution stack layer 111 in the packaging structure 100. In order words, the first prefabricated redistribution stack layer 811 and the second prefabricated redistribution stack layer 812 both include a dielectric layer and a prefabricated conductive layer that are stacked to each other alternatively; and the dielectric layer is provided with a via filled with metal, and the prefabricated conductive layers are electrically connected via the via.

In a preferred embodiment, the dielectric layer of both the first prefabricated redistribution stack layer 811 and the second prefabricated redistribution stack layer 812 may be provided with a magnetic film layer, and the magnetic film layer forms an inductor with the redistribution stack layer above and below the magnetic film layer.

In addition, a composite intermediary block 801 is provided on the outer side of the first plastic packaging layer 813 and includes a conductive structure 802 and a dielectric cladding layer 803 wrapped on the outer side of the conductive structure 802. Preferably, a coefficient of thermal expansion of the dielectric cladding layer 803 is less than a coefficient of thermal expansion of the first prefabricated redistribution stack layer 811 and second prefabricated redistribution stack layer 812. Due to the small coefficient of thermal expansion, the dielectric cladding layer 803 can effectively help the packaging structure 800 to overcome warpage.

The packaging structure 800 further includes passive elements 804, 807 and at least one first capacitor 806 that are embedded in the first plastic packaging layer 813. The passive elements 804, 807, such as inductors, are electrically connected to the first redistribution stack layer 130 via an outer layer 805 and configured to perform voltage regulation; and at least one first capacitor 806, such as a silicon capacitor chip, is stacked below the chip 1231 or device package 1231 in the thickness direction of the packaging structure 800 to better control the voltage drop.

In this embodiment, the plastic packaging and reconstitution is implemented by two layers of prefabricated redistribution stack layers, which can increase the space between the prefabricated redistribution stack layers to bury therein passive elements and capacitors with a large size.

In addition, the same reference numerals in FIG. 8 and FIG. 1 represent the same components having similar functions and will not repeated herein.

Figure 9:
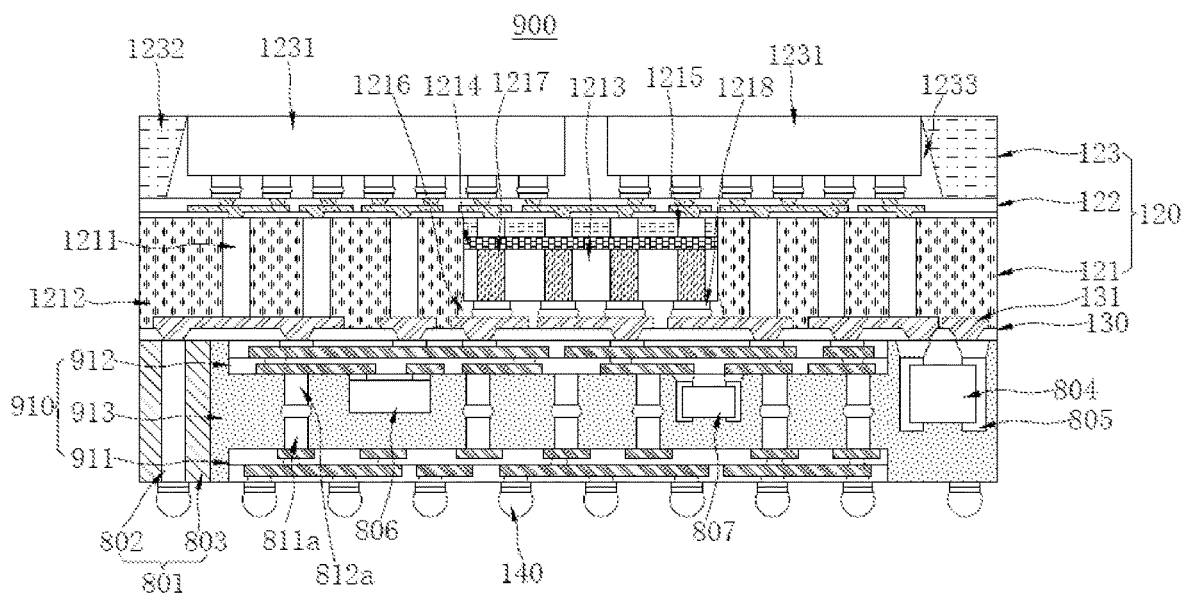
FIG. 9 is a schematic cross-sectional view of a packaging structure according to a ninth embodiment of the present invention.

As shown in FIG. 9, a ninth embodiment of the present invention also provides a packaging structure 900, which differs from the packaging structure 800 in following points. 1) In the packaging structure 900, a first plastic packaging material is adopted to replace the underfill material; in order words, the first prefabricated redistribution stack layer 911 and the second prefabricated redistribution stack layer 912 that are stacked to each other are plastic-packaged by the first plastic packaging layer 913. 2) The interconnected or functional chip 1213 is provided with an interconnected via 1217 that is filled with a conductive material such as copper; the interconnected redistribution stack layer 1214 is electrically connected to a connection pad 1218 at the bottom of the interconnected or functional chip 1213 via the interconnected via 1217, and the connection pad 1218 is electrically connected to the first conductive layer 131 of the first redistribution stack layer 130.

The connection pad 1218 and the first conductive layer 131 of the first redistribution stack layer 130 are bonded by tin-metal bonding or bonded directly by copper-copper diffusion.

In addition, the same reference numerals in FIG. 9 and FIG. 8 represent the same components having similar functions and will not repeated herein.

Figure 10:
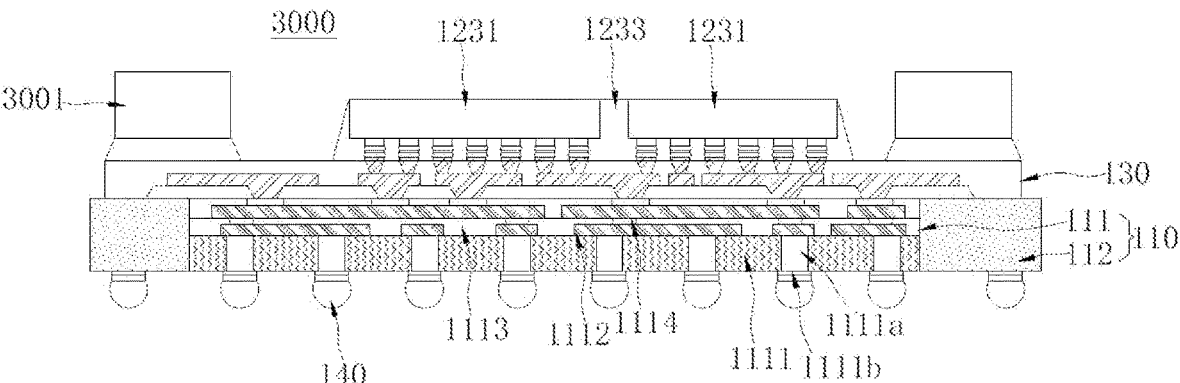
FIG. 10 is a schematic cross-sectional view of a packaging structure according to a tenth embodiment of the present invention.

As shown in FIG. 10, a tenth embodiment of the present invention also provides a packaging structure 3000, which differs from the packaging structure 100 in that the first prefabricated redistribution stack layer 111 in the packaging structure 3000 is plastic-packaged by the first plastic packaging layer 112 to form the lower package 110, and the first redistribution stack layer 130 is provided above the lower package 110. The chip 1231 and/or the device package 1231 is flip-mounted above the first redistribution stack layer 130 and electrically connected to the first redistribution stack layer 130.

An underfill material layer 1233 may be filled between the first redistribution stack layer 130 and the chip 1231 and/or device package 1231.

Optionally, a reinforcing structure 3001 is provided at the edge and/or corner of the first redistribution stack layer 130. The reinforcing structure 3001 may for example be made of a material with high thermal conductivity, which can not only reinforce the overall strength of the packaging structure 3000 but also enhance the heat dissipation. Further, optionally, a plastic packaging material may be provided above the first redistribution stack layer 130 to plastic-package the chip 1231 and/or device package 1231 and the reinforcing structure 3001.

The same reference numerals in FIG. 10 and FIG. 1 represent the same components having similar functions and will not repeated herein.

As shown in FIG. 25, a second object of the present invention is to provide a manufacturing method 2000 for a packaging structure, which includes steps of:

providing a first prefabricated redistribution stack layer, plastic-packaging the first prefabricated redistribution stack layer to form a first plastic packaging layer, and constituting a lower package;

forming a first redistribution stack layer on a side of the lower package, the first redistribution stack layer being electrically connected to the first prefabricated redistribution stack layer; and packaging an upper package above the first redistribution stack layer to obtain the packaging structure.

A minimum line width and line spacing of the first prefabricated redistribution stack layer is less than a minimum line width and line spacing of the first redistribution stack layer.

In a preferred embodiment, the step of providing the first prefabricated redistribution stack layer, plastic-packaging the first prefabricated redistribution stack layer to form the first plastic packaging layer, and constituting the lower package includes:

providing a carrier board on which a plurality of the first prefabricated redistribution stack layers that are pre-cut into single grains and include a support plate are temporarily bonded; applying a first plastic packaging material to the carrier board to plastic-package the first prefabricated redistribution stack layer and thereby form the first plastic packaging layer; and separating the first plastic packaging layer and the first prefabricated redistribution stack layer from the carrier board to obtain the lower package.

In a preferred embodiment, the step of packaging the upper package above the first redistribution stack layer to obtain the packaging structure includes:

forming a plurality of conductive metal pillars above the first redistribution stack layer; mounting an interconnected chip above the first redistribution stack layer, where a top portion of the interconnected chip away from the first redistribution stack layer includes an interconnected redistribution stack layer and a plurality of connection bumps; plastic-packaging the plurality of conductive metal pillars and the interconnected chip to form a second plastic packaging layer; thinning the second plastic packaging layer to expose the plurality of conductive metal pillars and the plurality of connection bumps; forming a second redistribution stack layer above the second plastic packaging layer, the second redistribution stack layer being electrically connected to the plurality of conductive metal pillars and the connection bumps; flip-bonding a chip and/or device package above the second redistribution stack layer; and plastic-packaging the chip and/or device package to form a third plastic packaging layer.

In a preferred embodiment, the manufacturing method 2000 further includes:

thinning a side of the first plastic packaging layer away from the first redistribution stack layer, and removing the support plate to expose the conductive layer on the back side of the first prefabricated redistribution stack layer; implanting a solder ball or metal bump on a plurality of pads, the solder ball or metal bump being electrically connected to the plurality of pads; and thinning the third plastic packaging layer to expose a back side of the chip and/or a back side of the device package.

The specific manufacturing process of each step in the manufacturing method 2000 will be detailed below by taking the packaging structure 100 as an example.

Figure 11:
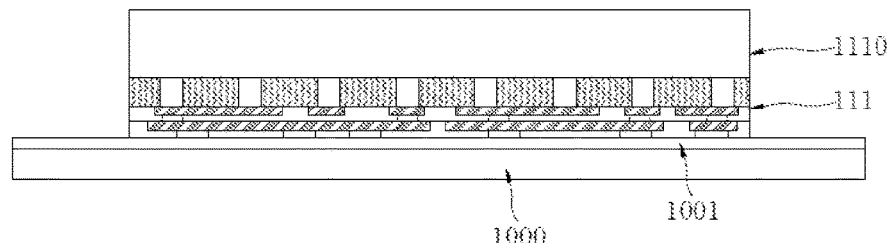
FIG. 11 is a schematic cross-sectional view for temporarily bonding a first prefabricated redistribution stack layer having a support plate to a carrier board.
Figure 12:
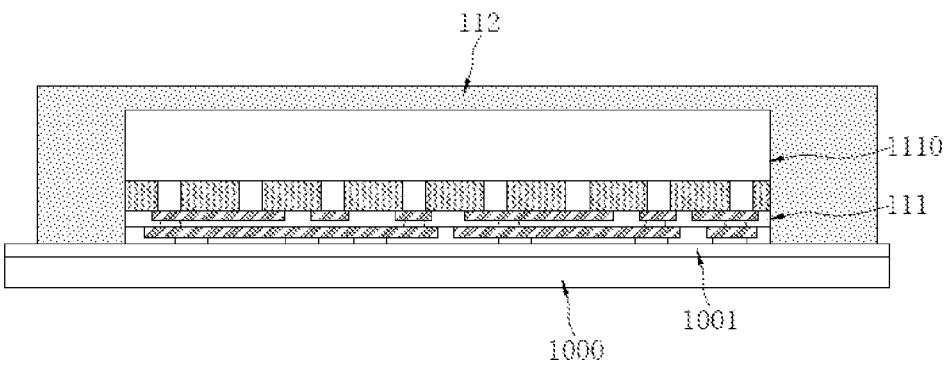
FIG. 12 is a schematic cross-sectional view for forming a first plastic packaging layer on a carrier board.
Figure 13:
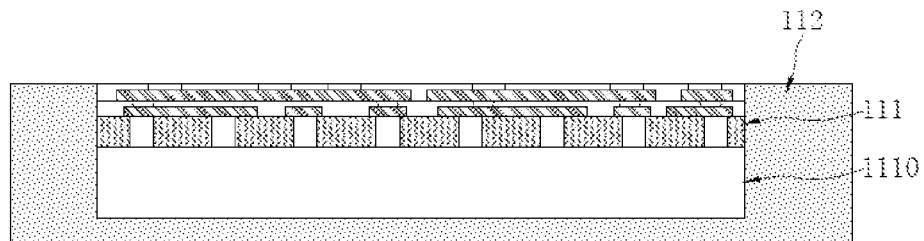
FIG. 13 is a schematic cross-sectional view for de-bonding a first plastic packaging layer, a first prefabricated redistribution stack layer and a carrier board.

As shown in FIGS. 11 to 13, the manufacturing process for forming the lower package includes following procedures.

A carrier board 1000 is provided, and a temporary bonding layer 1001 such as a temporary bonding adhesive is provided on the carrier board 1000. The temporary bonding layer 1001 is provided with a plurality of first prefabricated redistribution stack layers 111 that are pre-cut into single grains (only one grain is illustrated in FIG. 11). The first prefabricated redistribution stack layer 111 as pre-cut into single grains includes a support plate 1110. The first prefabricated redistribution stack layer 111 is firstly manufactured on the support plate 1110 with a wafer-level manufacturing process as an entire surface, and then cut into single grains of a certain size. In order words, the support plate 1110 is cut together with the first prefabricated redistribution stack layer 111. The support plate 1110 is capable of providing support for subsequent packaging process of the packaging structure, which avoids a decrease in the packaging yield as caused in the subsequent packaging process due to the low hardness of the first prefabricated redistribution stack layer 111.

The first plastic packaging material is coated on a surface of a side of the carrier board 1000. The first plastic packaging material covers the first prefabricated redistribution stack layer 111 and the temporary bonding layer 1001, such that a first plastic packaging layer 112 is formed after curing the first plastic packaging material.

With the de-bonding process, both the first plastic packaging layer 112 and the first prefabricated redistribution stack layer 111 are separated from the temporary bonding layer 1001 on the carrier board 1000 to obtain a lower package 110.

Figure 14:
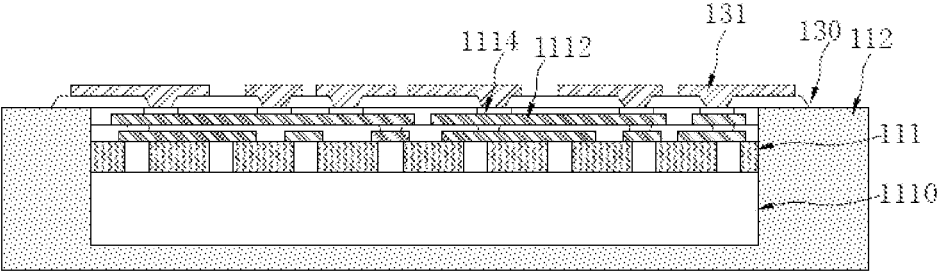
FIG. 14 is a schematic cross-sectional view for forming a first redistribution stack layer.

As shown in FIG. 14, a first redistribution stack layer 130 is manufactured on a surface of a side of the lower package 110 not covered by a first plastic packaging material, and a first conductive layer 131 in the first redistribution stack layer 130 is electrically connected to a first prefabricated conductive layer 1112 in the first prefabricated redistribution stack layer 111 via a first via or blind via 1114.

An upper package 120 in the packaging structure 100 is a non-prefabricated separate structure. Referring to FIGS. 15 to 18, an interconnected chip layer 121 is firstly manufactured above the first redistribution stack layer 130.

Figure 15:
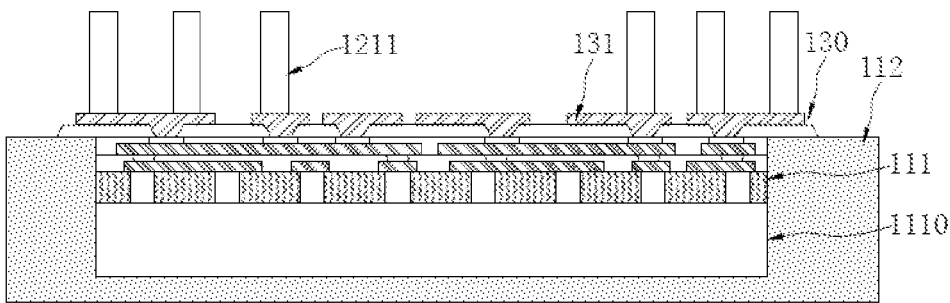
FIG. 15 is a schematic cross-sectional view for forming a conductive metal pillar.

As shown in FIG. 15, an interconnected conductive pillar 1211 is fabricated above the first redistribution stack layer 130, and a lower end of the interconnected conductive pillar 1211 is electrically connected to the first conductive layer 131 in the first redistribution stack layer 130.

Figure 16:
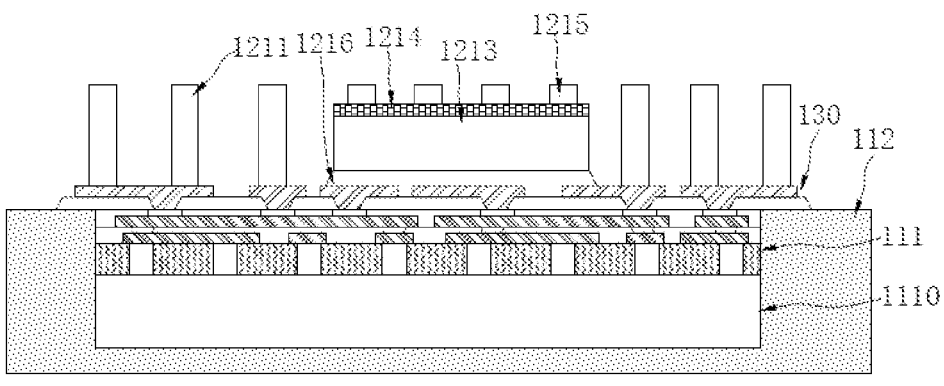
FIG. 16 is a schematic cross-sectional view for upright-bonding an interconnected chip to a first redistribution stack layer.

As shown in FIG. 16, an interconnected or functional chip 1213 is upright-bonded above the first redistribution stack layer 130 with a first upright-bonding material layer 1216. The interconnected or functional chip 1213 includes an interconnected redistribution stack layer 1214 and a plurality of connection bumps 1215 on a surface of a side of the interconnected or functional chip 1213 away from the first redistribution stack layer 130.

Figure 17:
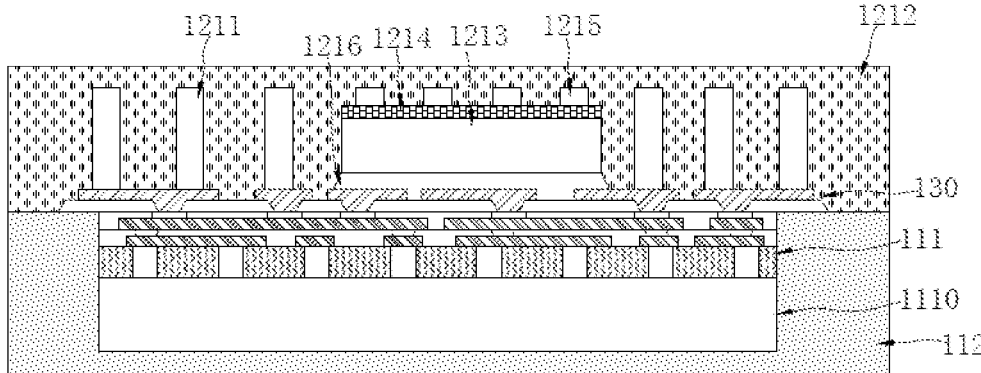
FIG. 17 is a schematic cross-sectional view for forming a second plastic packaging layer.

As shown in FIG. 17, a second plastic packaging material is applied above the first redistribution stack layer 130 to plastic-package a plurality of interconnected conductive pillars 1211 and interconnected or functional chips 1213 together; then, the second plastic packaging material is cured to form the second plastic packaging layer 1212, and at this time, the interconnected or functional chip 1213 is buried in the second plastic packaging layer 1212.

Figure 18:
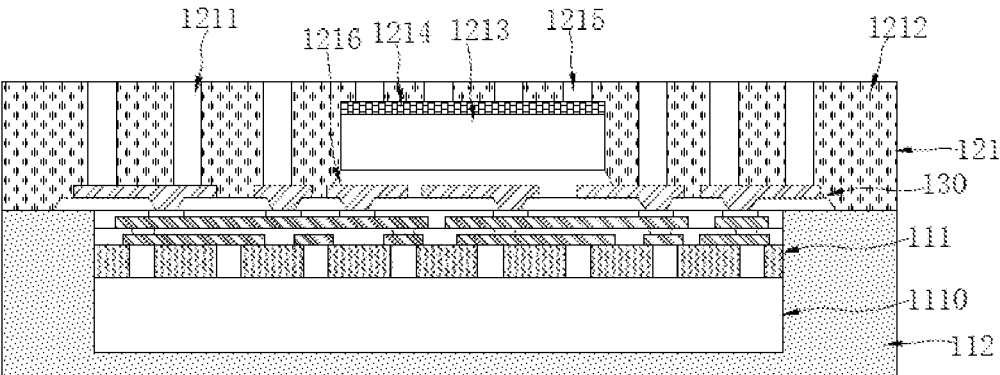
FIG. 18 shows a schematic cross-sectional view for thinning a second plastic packaging layer to expose a conductive metal pillar.

As shown in FIG. 18, an upper surface of the second plastic packaging layer 1212 (a side away from the first redistribution stack layer 130) is thinned to expose the plurality of interconnected conductive pillars 1211 and the plurality of connection bumps 1215, thereby finishing the manufacturing of the interconnected chip layer 121.

Figure 19:
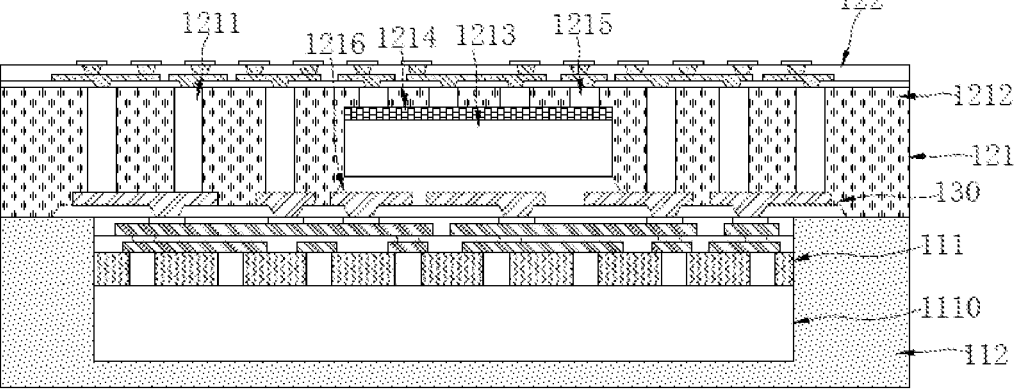
FIG. 19 is a schematic cross-sectional view for forming a second redistribution stack layer.

As shown in FIG. 19, a second redistribution stack layer 122 is manufactured above the interconnected chip layer 121, and a plurality of interconnected conductive pillars 1211 and a plurality of connection bumps 1215 are electrically connected to the second redistribution stack layer 122, respectively.

Figures 20, 21, 22:
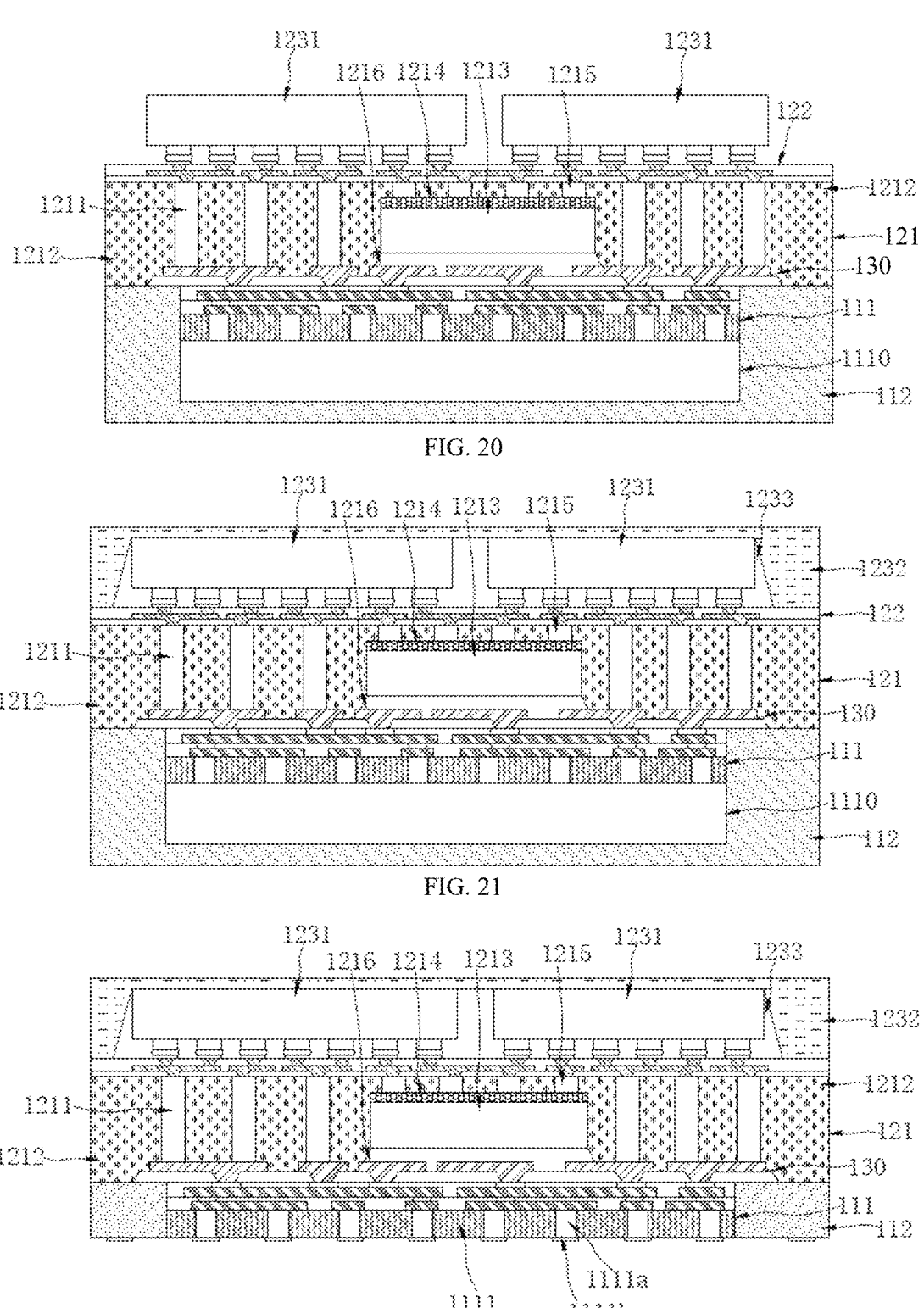
FIG. 20 is a schematic cross-sectional view for flip-bonding a chip and/or device package to a second redistribution stack layer.
FIG. 21 is a schematic cross-sectional view for forming a third plastic packaging layer.
FIG. 22 is a schematic cross-sectional view for thinning a first plastic packaging layer and de-bonding a support plate.

As shown in FIG. 20, at least one chip 1231 and/or at least one device package 1231 is flip-bonded above the second redistribution stack layer 122, and the chip 1231 or device package 1231 is electrically connected to the second redistribution stack layer 122, respectively.

As shown in FIG. 21, the second underfill material is filled between the second redistribution stack layer 122 and the chip 1231 or device package 1231 to form the underfill material layer 1233; then, a third plastic packaging material is applied above the second redistribution stack layer 122 to plastic-package the chip 1231 and/or device package 1231; and after the third plastic packaging material is cured, a third plastic packaging layer 1232 is formed.

As shown in FIG. 22, a side of the first plastic packaging layer 112 away from the first redistribution stack layer 130 is thinned, and the support plate 1110 and the first prefabricated redistribution stack layer 111 are unbonded, such that a first base material layer 1111 in the first prefabricated redistribution stack layer 111 is exposed; then, a plurality of pads 1111b are manufactured on a back side of the first base material layer 1111, and the pads 1111b are electrically connected with a plurality of copper pillars 1111a embedded in the first base material layer 1111.

As shown in FIG. 23, a plurality of metal bumps 140 are manufactured on the pads 1111b, and the metal bumps 140 are, for example, metal bumps with tin caps. Optionally, the copper pillar 11111a may directly serve as the pad, and the metal bump 140 may be directly balled or bonded to a surface of the copper pillar 1111a. In other embodiments of the present invention, a plurality of solder balls (tin balls) may also be implanted on the pad.

As shown in FIG. 24, the upper surface of the third plastic packaging layer 1232 (a side away from the second redistribution stack layer 122) is thinned to expose the back side of the chip 1231 or device package 1231. Optionally, a multi-metal stack layer such as Ti/Ni/Ag or Ti/Ni/Au is deposited on a back side of the chip 1231, the plastic packaging material and possibly the underfill material 1233 for soldering of the thermal interface material at the back side, such as the fitting of an indium chip to a heat dissipating sheet or cover.

In the process of manufacturing the metal bump 140, the chip 1231 and/or device package 1231 is buried within the third plastic packaging layer 1232 to avoid the external environment from adversely affecting the chip 1231 and/or the device package 1231 and thereby help to improve the yield.

For other embodiments of the present invention, the lower package of the packaging structure is, for example, a substrate unit including a first prefabricated redistribution stack layer and a second prefabricated redistribution stack layer that are stacked to and electrically connected to each other. The first prefabricated redistribution stack layer herein and the second prefabricated redistribution stack layer may be prefabricated on the same support plate or be bonded to each other after they are formed separately on different support plates. The substrate unit including the support plate is pre-cut into single grains, and then plastic-packaged and reconstituted as a lower package for subsequent packaging.

In other embodiments of the present invention, the upper package of the packaging structure is a prefabricated separate packaging unit, which is a corresponding packaging structure as acquired by flip-bonding the upper package directly to the first redistribution stack layer after plastic-packaging the first prefabricated redistribution stack layer and manufacturing the first redistribution stack layer. Alternatively, when the upper package includes only the packaging layer having the chip and/or device package and the second redistribution stack layer, the upper package is directly flip-bonded above the interconnected chip packaging layer and electrically connected to the interconnected conductive pillar. Finally, a second plastic packaging layer for plastic-packaging the interconnected conductive pillar, the interconnected chip and the upper package is formed to obtain the corresponding packaging structure.

The present invention provides a packaging structure and a manufacturing method thereof. The lower package of the packaging structure includes a first prefabricated redistribution stack layer and a first redistribution stack layer disposed above the first prefabricated redistribution stack layer; and a line width and line spacing of at least one prefabricated conductive layer in the first prefabricated redistribution stack layer is less than a line width and line spacing of at least one first conductive layer in the first redistribution stack layer. Since the single-grained prefabricated redistribution stack layer is plastic-packaged to form a reconstituted substrate, the line width and line spacing and the thickness of the prefabricated redistribution stack layer may be reduced, thereby effectively meeting the packaging requirements in high density and small packaging size.

In addition, by manufacturing the redistribution stack layer on the reconstituted substrate, the redistribution stack layer may be stacked to the prefabricated redistribution stack layer within the reconstituted substrate one another, and thereby may be taken as a voltage control circuit such as an inductor or a capacitor to thereby implement functions of the packaging structure such as filtering, oscillating, delaying, trapping, signal screening, noise filtering, current stabilizing, suppressing of the electromagnetic interference, and the like.

The present invention has been described by the aforesaid related embodiments; however, the aforesaid embodiments are only examples of the implementation of the present invention. In addition, the technical features involved in different embodiments of the present invention described above may be combined with each other as long as they do not constitute a conflict with each other. It shall be noted that the present invention can be illustrated by way of other various embodiments, and various modifications and variations can be made by those skilled in the art according to the present invention without departing from the scope and spirit of the present invention; however, these modifications and variations shall all be made within the protection scope of the attached claims.

What is claimed is:

1. A packaging structure, comprising:
   a lower package, an upper package disposed above the lower package, and a first redistribution stack layer disposed between the lower package and the upper package, wherein the first redistribution stack layer is electrically connected to the lower package and the upper package;

wherein the lower package comprises a first prefabricated redistribution stack layer and a first plastic packaging layer surrounding the first prefabricated redistribution stack layer; and wherein a minimum line width and line spacing of at least one first prefabricated conductive layer in the first prefabricated redistribution stack layer is less than a minimum line width and line spacing of at least one first conductive layer in the first redistribution stack layer.

2. The packaging structure according to claim 1, wherein the first prefabricated redistribution stack layer comprises a magnetic film layer that is stacked above a first base material layer of the first prefabricated redistribution stack layer, or is stacked above a first dielectric layer of the first prefabricated redistribution stack layer; wherein the first prefabricated redistribution stack layer, the magnetic film layer, and the first redistribution stack layer constitute an inductor of the packaging structure.

3. The packaging structure according to claim 1, wherein the upper package comprises:

an interconnected chip packaging layer disposed above the first redistribution stack layer, a second redistribution stack layer disposed above the interconnected chip packaging layer, and a packaging layer having a chip and/or device package and disposed above the second redistribution stack layer;

wherein the interconnected chip packaging layer comprises: a plurality of interconnected conductive pillars, an interconnected chip and a second plastic packaging layer, wherein the plurality of interconnected conductive pillars and the interconnected chip are plastic-packaged above the first redistribution stack layer by the second plastic packaging layer, and two ends of each interconnected conductive pillar are electrically connected to the first redistribution stack layer and the second redistribution stack layer;

wherein the packaging layer having the chip and/or device package comprises a chip and/or device package and a third plastic packaging layer, wherein the chip and/or device package is flip-bonded to the second redistribution stack layer, and the chip and/or device package are plastic-packaged above the second redistribution stack layer by the third plastic packaging layer; and wherein the interconnected chip is upright-bonded to the first redistribution stack layer; the interconnected chip comprises an interconnected redistribution stack layer on a surface at a side facing toward the second redistribution stack layer; and at least one conductive layer of the interconnected redistribution stack layer has a minimum line width and line spacing of less than 2 μm, and the interconnected redistribution stack layer further comprises at least one capacitor.

4. The packaging structure according to claim 3, wherein the interconnected chip is provided with a trench-type capacitor.

5. The packaging structure according to claim 3, wherein the interconnected chip is provided with an interconnected via through which the interconnected redistribution stack layer is electrically connected to the first redistribution stack layer together with a connection pad in a body of the chip approximate to the first redistribution stack layer.

6. The packaging structure according to claim 3, further comprising: at least one first capacitor and/or at least one second capacitor;

wherein the at least one first capacitor is embedded within the first prefabricated redistribution stack layer or within the first plastic packaging layer; and the at least one first capacitor is disposed below the chip and/or device package of the upper package in a thickness direction of the packaging structure;

wherein the at least one second capacitor is embedded within the second plastic packaging layer and/or the third plastic packaging layer; and wherein the at least one first capacitor is electrically connected to the first prefabricated redistribution stack layer, and the at least one second capacitor is electrically connected to the first redistribution stack layer and/or the second redistribution stack layer.

7. The packaging structure according to claim 3, further comprising: at least one first virtual element and/or at least one second virtual element;

wherein the at least one first virtual element is provided above the first redistribution stack layer and is disposed at a corner or perimeter of the first redistribution stack layer; and wherein the at least one second virtual element is provided above the second redistribution stack layer and is disposed at a corner or perimeter of the second redistribution stack layer.

8. The packaging structure according to claim 1, wherein the lower package further comprises:

a composite intermediary block which is provided at an edge and/or corner of the lower package and is adjacent to the first plastic packaging layer, wherein the composite intermediary block comprises a conductive structure and a dielectric cladding layer wrapped around an outer side of the conductive structure, and a side of the conductive structure is electrically connected to the first redistribution stack layer; and wherein a coefficient of thermal expansion of the dielectric cladding layer is less than a coefficient of thermal expansion of the first prefabricated redistribution stack layer.

9. The packaging structure according to claim 1, further comprising: a metal block and a metal coating that are electrically connected, wherein the metal block is embedded within the upper package and electrically connected to a second redistribution stack layer of the upper package, and the metal coating is provided above an exposed surface of the upper package, the exposed surface being away from the lower package.

10. The packaging structure according to claim 1, wherein the lower package further comprises: a second prefabricated redistribution stack layer, wherein the second prefabricated redistribution stack layer and the first prefabricated redistribution stack layer are stacked to and electrically connected to each another;

the first redistribution stack layer and the second prefabricated redistribution stack layer are plastic-packaged by the first plastic packaging layer; or the lower package further comprises an underfill material layer that is sandwiched between the first prefabricated redistribution stack layer and the second prefabricated redistribution stack layer, such that the first prefabricated redistribution stack layer and the second prefabricated redistribution stack layer are reconstituted as a prefabricated redistribution stack layer unit which is plastic-packaged by the first plastic packaging layer.

11. The packaging structure according to claim 1, wherein the first prefabricated redistribution stack layer comprises: a first base material layer, and a first conductive layer and a first dielectric layer that are alternately stacked on a side of the first base material layer, wherein the first base material layer is embedded with a plurality of copper pillars, a plurality of pads protrude from ends of the plurality of copper pillars respectively, and the plurality of pads are provided with metal bumps with tin caps or tin balls respectively.

12. A manufacturing method of a packaging structure, comprising steps of:

providing a first prefabricated redistribution stack layer, plastic-packaging the first prefabricated redistribution stack layer to form a first plastic packaging layer, and constituting a lower package;

forming a first redistribution stack layer on a side of the lower package, the first redistribution stack layer being electrically connected to the first prefabricated redistribution stack layer; and packaging an upper package above the first redistribution stack layer to obtain the packaging structure;

wherein a minimum line width and line spacing of at least one prefabricated conductive layer in the first prefabricated redistribution stack layer is less than a minimum line width and line spacing of at least one first conductive layer in the first redistribution stack layer, and the first prefabricated redistribution stack layer and the first redistribution stack layer constitute a voltage control circuit of the packaging structure.

13. The manufacturing method according to claim 12, wherein the step of providing the first prefabricated redistribution stack layer, plastic-packaging the first prefabricated redistribution stack layer to form the first plastic packaging layer, and constituting the lower package comprises:

providing a carrier board on which a plurality of the first prefabricated redistribution stack layers that are pre-cut into single grains and comprise a support plate are temporarily bonded;

applying a first plastic packaging material to the carrier board to plastic-package the first prefabricated redistribution stack layer and thereby form the first plastic packaging layer; and separating the first plastic packaging layer and the first prefabricated redistribution stack layer from the carrier board to obtain the lower package.

14. The manufacturing method according to claim 13, wherein the step of packaging the upper package above the first redistribution stack layer to obtain the packaging structure comprises:

forming a plurality of conductive metal pillars above the first redistribution stack layer;

mounting an interconnected chip above the first redistribution stack layer, wherein a top portion of the interconnected chip away from the first redistribution stack layer comprises an interconnected redistribution stack layer and a plurality of connection bumps;

plastic-packaging the plurality of conductive metal pillars and the interconnected chip to form a second plastic packaging layer;

thinning the second plastic packaging layer to expose the plurality of conductive metal pillars and the plurality of connection bumps;

forming a second redistribution stack layer above the second plastic packaging layer, wherein the second redistribution stack layer is electrically connected to the plurality of conductive metal pillars and the connection bumps;

flip-bonding a chip and/or device package above the second redistribution stack layer; and plastic-packaging the chip and/or device package to form an optional third plastic packaging layer.

15. The manufacturing method according to claim 14, further comprising:

thinning a side of the first plastic packaging layer away from the first redistribution stack layer, and removing the support plate to expose a plurality of pads of the first prefabricated redistribution stack layer;

implanting a solder ball or metal bump on the plurality of pads, wherein the solder ball or metal bump is electrically connected to the plurality of pads; and thinning the third plastic packaging layer to expose a back side of the chip and/or a back side of the device package.

* * * * *